(12) United States Patent
Aihara et al.

(10) Patent No.: US 6,416,889 B2
(45) Date of Patent: Jul. 9, 2002

(54) ANTI-CORROSION CERAMIC MEMBER

(75) Inventors: Yasufumi Aihara, Sunneyvale, CA (US); Keiichiro Watanabe, Kasugai (JP); Shinji Kawasaki, Nagoya (JP); Akira Narukawa, Yokkaichi (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/294,211

(22) Filed: Apr. 19, 1999

(30) Foreign Application Priority Data

Apr. 20, 1998 (JP) .......................... 10-123915

(51) Int. Cl.[7] .............. B32B 9/00; B32B 7/04
(52) U.S. Cl. ............. 428/696; 428/698; 428/699; 118/715
(58) Field of Search .............. 428/698, 699, 428/696; 118/715

(56) References Cited

U.S. PATENT DOCUMENTS

| | | | |
|---|---|---|---|
| 3,591,668 A | 7/1971 | Walker et al. ............. 264/646 |
| 5,068,938 A | 12/1991 | Roscoe ................. 14/71.7 |
| 5,130,295 A | 7/1992 | Labib ................... 505/234 |
| 5,306,895 A | 4/1994 | Ushikoshi et al. ......... 219/385 |
| 5,855,950 A | * 1/1999 | Bunker .................. 427/2.27 |
| 6,051,303 A | * 4/2000 | Katsuda et al. ............ 428/138 |

FOREIGN PATENT DOCUMENTS

| | | | |
|---|---|---|---|
| EP | 0939067 A1 | * | 1/1999 |
| JP | 359150427 A | * | 8/1984 |
| JP | 5-251365 | | 9/1993 |
| JP | 409328382 A | * | 12/1997 |
| JP | 410087382 A | * | 4/1998 |

* cited by examiner

Primary Examiner—Deborah Jones
Assistant Examiner—Stephen Stein
(74) Attorney, Agent, or Firm—Burr & Brown

(57) ABSTRACT

An anti-corrosion ceramic member having a substrate made of a ceramic material, a surface layer made of a fluoride and formed on the substrate, and an intermediate layer formed between the substrate and the surface layer and having the ceramic material of the substrate and the fluoride.

26 Claims, 2 Drawing Sheets

ANTI-CORROSION CERAMIC MEMBER

BACKGROUND OF THE INVENTION

(1) Field of the Invention

This invention relates to an anti-corrosion ceramic member, more particularly to an anti-corrosion ceramic member favorably usable for a member of equipment for manufacturing a semiconductor, such as thermal CVD equipment.

(2) Related Art Statement

With enlarging the capacity of VLSIs, the VLSIs have come to be increasingly micro-processed, which have enlarged uses of processes requiring chemical reactions. Particularly in semiconductor-manufacturing equipment requiring a super clean condition, a halogen-based corrosion gas such as a chlorine-based gas or a fluorine-based gas is used as a deposition gas, an etching gas or a cleaning gas.

In manufacturing equipment for a semiconductor, such as a CVD equipment, as a heater to heat a substance contact with such a corrosion gas, the halogen-based corrosion gas such as $CiF_3$, $NF_3$, $CF_4$, HF or HCl is used as a semiconductor cleaning gas after deposition. Moreover, during the deposition, a halogen-based corrosion gas such as $WF_6$, $SiH_2$, or $Cl_2$ is employed as a gas for forming a film.

Each of the members composing the semiconductor-manufacturing equipment is made of a ceramic material such as alumina or aluminum nitride. Accordingly when these members are exposed to and contacted with the above halogen-based corrosion gas at a high temperature, the surfaces of the members are corroded and the thus corroded portions of the surface are peeled off from the members in the form of particles.

The above particles are deposited on a substrate arranged in the semiconductor-manufacturing equipment, which results in poor insulation and poor conductivity, making the resulting semiconductor porous.

Considering the above problem, NGK Insulators, Ltd. disclosed in Japanese patent application No. 3-150932 (filed on May 28, 1991) and Japanese patent application No. 4-58727 (filed on Feb. 13, 1992), etc. that a sintered body of aluminum nitride with a layer of aluminum fluoride on its surface has a high corrosion resistance against a plasma of a halogen-based corrosion gas.

However when a ceramic member having a fluoride layer such as aluminum fluoride on its surface is employed as a member for the semiconductor-manufacturing equipment as mentioned above, the fluoride layer may be peeled off due to rapid changes in temperature inside the semiconductor manufacturing equipment. The peeled fluoride is in the form of particles. When the fluoride particles are deposited on the substrate, the deposited fluoride particles make the thus obtained semiconductor unacceptable.

SUMMARY OF THE INVENTION

It is an object of the present invention to provide an anti-corrosion ceramic member having a surface layer of a fluoride with good adherence to a substrate and having a high corrosion resistance against a plasma of a halogen-based corrosion gas.

This invention relates to an anti-corrosion ceramic member comprising a substrate made of a ceramic material, a surface layer made of a fluoride and formed on the substrate, and an intermediate layer formed between the substrate and the surface layer and comprising the ceramic material of the substrate and the fluoride.

The anti-corrosion ceramic member of this invention has a fluoride surface layer on its surface, so that the member has a high corrosion resistance against the halogen-based corrosion gas plasma.

Since the intermediate layer, which comprises the ceramic material of the substrate and the fluoride, is formed between the ceramic substrate and the fluoride surface layer, the adherence of the fluoride surface layer to the ceramic substrate is improved. Consequently the fluoride surface layer is not peeled off of the ceramic member even with rapid changes in temperature, which can prevent the disorders of the semiconductor which occur due to occurrence of particles being peeled from the fluoride surface layer.

The reason why the fluoride surface layer is not peeled off by forming the above intermediate layer is not clear, but it may be as follows.

That is, if rapid changes in temperature happen, large thermal stress is generated between the substrate of such as alumina and a fluoride due to a difference in heat expansion therebetween. However when the above intermediate layer made of the material composing the ceramic substrate and the fluoride is formed between the substrate and the fluoride, its act as a buffer layer to reduce the difference in the heat expansion therebetween and prevent the occurrence of rapid thermal stress, so that the adherence of the fluoride surface layer to the substrate is improved and thereby the fluoride surface layer is not peeled off.

BRIEF DESCRIPTION OF THE DRAWINGS

For a better understanding of this invention, reference is made to the attached drawings, wherein.

DESCRIPTION OF THE PREFERRED EMBODIMENTS

In the following, the present invention will be explained in more detail along with embodiments of the invention.

In an anti-corrosion ceramic member of the present invention, it is required that between a substrate made of a ceramic material and a surface layer of a fluoride is formed an intermediate layer made of the ceramic material and the fluoride. Without the intermediate layer formed, the fluoride surface layer is peeled off as above mentioned, so that the object of this invention cannot be realized.

For more effectively realizing the object of the invention by preventing the peeling-off of the fluoride surface layer from the substrate, preferably the amount of the fluoride in the intermediate layer increases inclinedly as a location goes to the surface layer from the ceramic substrate.

Although the mixed rate of the fluoride in the intermediate layer is not particularly limited, it is preferably 20 vol % to 80 vol %, more preferably 40 vol % to 70 vol %.

From the viewpoint of the adherence of the fluoride surface layer to the substrate, the intermediate layer is preferably formed so that the fluoride in the intermediate layer may fill in among the grain boundaries of the substrate.

Moreover for attaining more effectively the object of this invention as mentioned above, the thickness of the intermediate layer is preferably 10 $\mu$m to 500 $\mu$m, more preferably 50 $\mu$m to 200 $\mu$m.

A material usable for the ceramic substrate in this invention is not particularly limited, and thus can be chosen from among general-purpose ceramic materials. However, such a material preferably contains at least aluminum to realize this object by forming the intermediate layer more easily.

Concretely alumina ($Al_2O_3$), aluminum nitride (AlN), mullite ($3Al_2O_3.2SiO_2$), spinel ($MgO.Al_2O_3$) and the like may be given as examples.

A manufacturing method for the anti-corrosion ceramic member is not particularly limited, but from the viewpoint of easily forming the intermediate layer having the above characteristic, it may be preferably manufactured by the following method.

A ceramic powder of a ceramic material such as the above alumina and a binder are mixed by a ball-mill, and the thus obtained mixture is compacted by a uniaxial press molding method or the like to obtain a compacted body of the ceramic material. A ceramic sintered body of the ceramic material is, thereafter, formed by pressureless sintering. Succeedingly, the sintered body is preferably subjected to a surface processing or the like.

Figure 1:
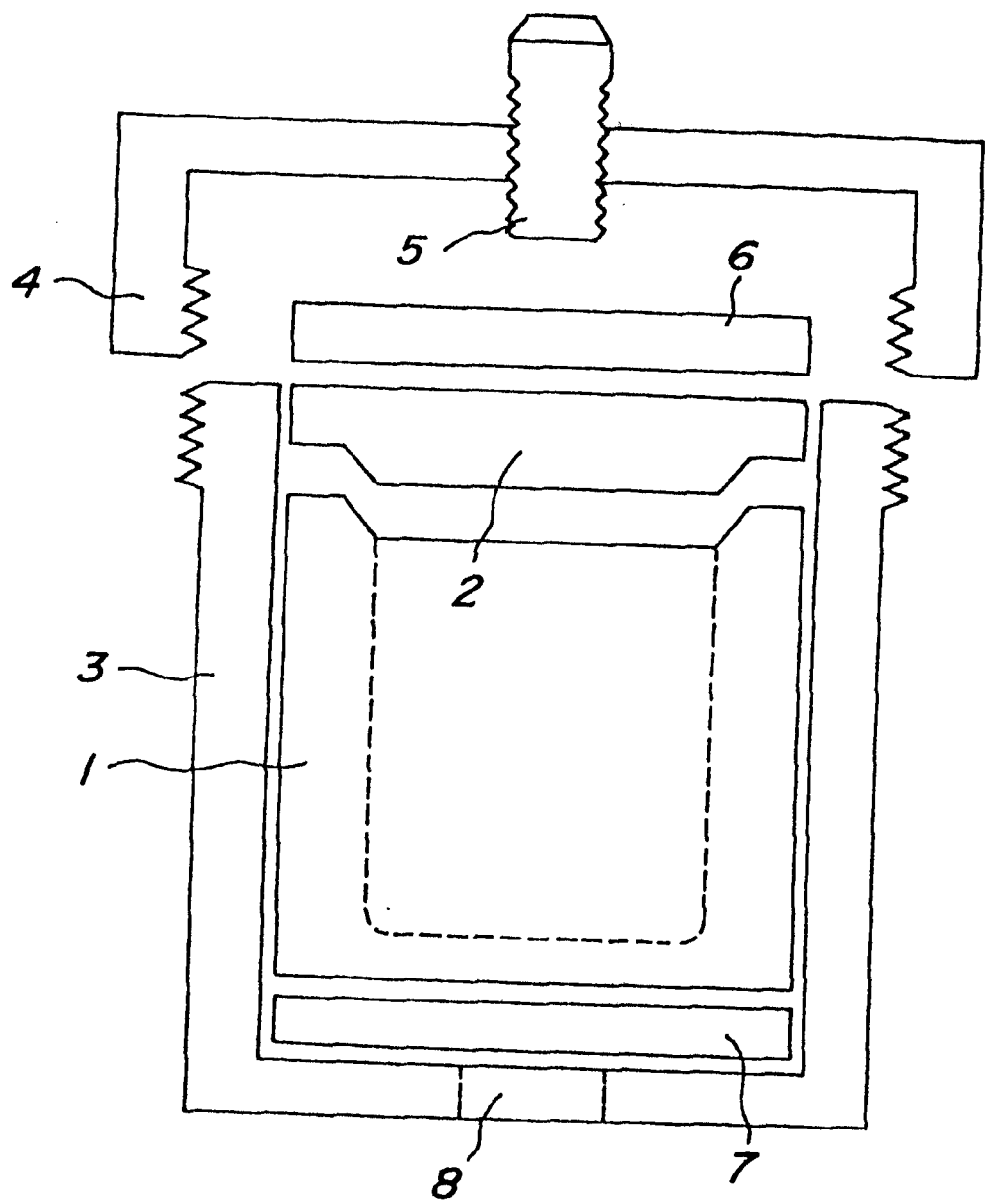
FIG. 1 is a cross-sectional view showing a hydrofluoric acid reactor to manufacture an anti-corrosion ceramic member according to the present invention.

The sintered body is accommodated into a container 1 made of Teflon having a given amount of hydrofluoric acid therein as shown in FIG. 1, thereafter the Teflon container 1 is covered and sealed with a lid 2 made of Teflon.

Then, the Teflon container 1 is set on a lower board 7 in a holding container 3 made of stainless steel and accommodated into the holding container 3, thereafter a lid 4 made of stainless steel is screwed to the stainless steel holding container 3.

Thereafter, the stainless steel lid 4 is tightened to the stainless steel holding container 3 by screwing in a tightening bolt 5 provided on the stainless steel lid 4.

The stainless steel holding container 3 is then accommodated into a dryer, for example, heated up preferably to 100° C. through 250° C., more preferably to 130° C. through 200° C., and held for 5 hours to 20 hours at the same temperature.

During heating, hydrogen fluoride (HF) gas penetrating via the Teflon container 1 is released outside through a gas escape hole 8.

After finishing the above thermal treatment, when the temperature of the interior of the stainless steel holding container 3 is below 30° C., the stainless lid 4 and the Teflon steel lid 2 are removed and the ceramic sintered body which has been treated with hydrofluoric acid is taken out of the Teflon container 1.

The concentration of the hydrofluoric acid usable for this invention is not particularly limited, but for forming a uniform fluoride film over the entire surface layer of the ceramic sintered body and easily forming the intermediate layer having the above characteristics, it is preferably 5 wt % to 50 wt %, more preferably 5 wt % to 30 wt %.

The anti-corrosion ceramic member according to the present invention can be effectively used as a substrate for a part which is to be exposed to high temperatures of about 400° C. to 500° C. and would suffer from vigorous corrosion, the part being, in a semiconductor-manufacturing equipment such as thermal CVD equipment, for example, a susceptor to be heated with infrared lamp, a ceramic heater for heating a semiconductor and a susceptor set on a heat-generating face of such a ceramic heater, a susceptor in which an electrode for electrostatic chucking is embedded, a susceptor in which an electrode for electrostatic chucking and resistive heat-generating bodies are embedded, a susceptor in which an electrode for generating a high frequency plasma and resistive heat-generating bodies are embedded.

Furthermore from the viewpoint of preventing the peeling-off of particles precipitated again on the anti-corrosion ceramic member according to the present invention, which particles are formed from a gaseous fluoride product generated through corrosion of the ceramic member, the anti-corrosion ceramic member of the invention can be effectively used as a substrate for a part to be exposed to relatively low temperatures of 200° C. to 400° C., for example, a shower plate.

This invention is described in detail hereinafter with reference to the following examples.

EXAMPLE

Alumina powder (particle size of 0.5 $\mu$m) was put into a given mold, and uniaxially pressed at a pressure of 200 kgf/cm$^2$ to obtain a rectangular parallelepiped pressed body. Thereafter the pressed body was fired for 4 hours to form a sintered body of alumina having a length of 60 mm, a width of 60 mm, and a thickness of 20 mm. Samples each having a length of 10 mm, a width of 10 mm, and a thickness of 5 mm were cut out of the thus obtained sintered body, and opposite 10 mm×10 mm surfaces of each sample were so polished that the surface roughness Ra of the surfaces might be about 0.5 $\mu$m.

Each of the sintered bodies was accommodated into the Teflon container 1 as shown in FIG. 1 having 20 cc of hydrofluoric acid with a concentration given in Table 1, and the Teflon container 1 was accommodated into the stainless holding container 3 in the same manner as described above.

The stainless holding container 3 was set into a dryer (manufactured by Yamato Kagaku Corp.), and thereafter heated up to 200° C. at which the sintered body was treated at the same temperature with hydrofluoric acid. The heating time varied among three of 16 hours, 40 hours, and 100 hours.

Thereafter the stainless holding container 3 was cooled below 30° C. by leaving it at room temperature, and the alumina sintered body was taken out.

The sections of the treated sintered bodies were polished. The thickness of its intermediate layer formed on alumina sintered body and the mixed ratio of the aluminum fluoride therein were examined. The thus obtained values are listed in Table 1, depending upon the concentration of hydrofluoric acid, etc.

In this case, the thickness of the intermediate layer was arrived from the thickness of the area in which the oxygen of the sample made of alumina sintered body and the fluoride of the aluminum fluoride layer coexisted, by analyzing the distributions of oxygen and fluoride in the section of the intermediate layer through EPMA.

The mixed ratio of aluminum fluoride in the intermediate layer was calculated from the ratio of mapped areas between oxygen and fluorine, respectively according to the following equation, and defined as "vol. %" by using the area ratio.

$$\text{a mix rate of an aluminum fluoride (\%)} = \frac{\text{an existing area of an aluminum fluoride}}{\text{a total area of an intermediate layer}} \times 100$$

TABLE 1

A thickness of a mixed layer (μm) and a ratio of aluminum fluoride in an intermediate layer (%)

| | 200° C. | | |
|---|---|---|---|
| | 16 h | 40 h | 100 h |
| 1% HF | 0 (0%) | 20 (10%) | 20 (10%) |
| 5% HF | 40 (40%) | 60 (50%) | 80 (60%) |
| 15% HF | 70 (50%) | 110 (70%) | 200 (80%) |
| 46% HF | 50 (20%) | 60 (20%) | 60 (20%) |

Then, a heat-cycling test was carried out for the hydrofluoric acid-treated alumina sintered body, and the adherence of the aluminum fluoride layer formed on the alumina sintered body was examined.

In this case, one cycle in the heat-cycling test was that after the sample was heated up to 500° C. from room temperature in 5 minutes, being held at the same temperature for 15 minutes, it was cooled down up to room temperature from 500° C. in 10 minutes. In this example, 100 cycles were carried out as the heat-cycling test. The thus obtained results are listed in Table 2.

The evaluation of the adherence in the heat-cycling test was done by the following standard.

⊚ (No change in the aluminum fluoride surface layer after the heat-cycling test)

○: (A few cracks in the aluminum fluoride surface layer after the heat-cycling test)

Δ: (Many cracks in the aluminum fluoride surface layer after the heat-cycling test)

X: (Aluminum fluoride surface layer peeled off after the heat-cycling test)

TABLE 2

Results of heat cycle test

| | 200° C. | | |
|---|---|---|---|
| | 16 h | 40 h | 100 h |
| 1% HF | X | Δ | Δ |
| 5% HF | ○ | ⊚ | ⊚ |
| 15% HF | ⊚ | ○ | Δ |
| 46% HF | Δ | Δ | Δ |

Apparent from Table 2, in the anti-corrosion ceramic member of this invention having the ceramic substrate and the intermediate layer of fluoride, its aluminum fluoride surface layer was not peeled off and has a high adherence to the ceramic substrate.

Figure 2:
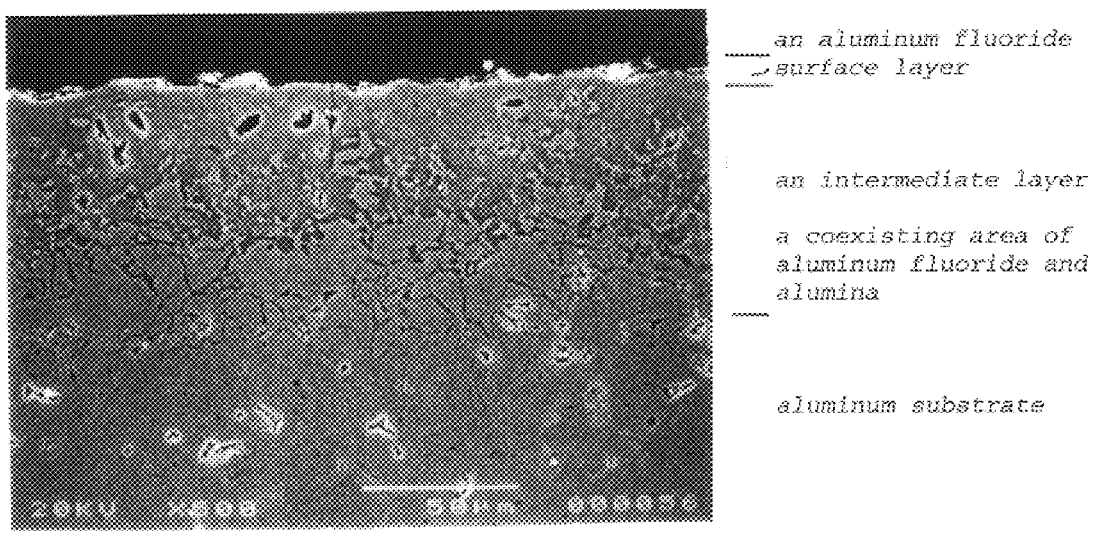
FIG. 2 is a cross-sectional SEM photograph of an anti-corrosion ceramic material according to the present invention.

FIG. 2 is a cross sectional SEM photograph of the anti-corrosion ceramic member of this invention in which a mixed layer was formed by heating it at 150° C. for 16 hours with the hydrofluoric acid at a concentration of 15 wt %. In FIG. 2, a thinner colored part in a lower part presents the ceramic substrate and a thicker colored part in a surface portion thereof presents the aluminum fluoride layer.

A part in which the thinner colored part and the thicker colored part are mixed, presents the intermediate layer.

Apparent from FIG. 2, the intermediate layer in the anti-corrosion ceramic member of this invention shows the mixed state of the material composing the ceramic substrate and the aluminum fluoride, and the amount of the aluminum fluoride increases in the direction from the ceramic substrate to the aluminum fluoride surface layer.

The anti-corrosion ceramic member of this invention has the fluoride surface layer with good adherence, so that without the disorder of a semi-conductor due to the peeling-off of the fluoride surface layer, the ceramic member having good anti-corrosion against the halogen-based corrosion gas can be provided.

What is claimed is:

1. An anti-corrosion ceramic member comprising a substrate made of a ceramic material, a surface layer made of a fluoride and formed on the substrate, and an intermediate layer formed of the ceramic material and the fluoride between the substrate and the surface layer by immersing the ceramic substrate into hydrofluoric acid so that the fluoride in the intermediate layer fill in among the grain boundaries thereof.

2. An anti-corrosion ceramic member as claimed in claim 1, wherein the concentration of the fluoride in the intermediate layer increases from the ceramic substrate to the surface layer.

3. An anti-corrosion ceramic member as claimed in claim 1, wherein the ceramic member contains at least aluminum.

4. An anti-corrosion ceramic member as claimed in claim 1, wherein the concentration of the fluoride in the intermediate layer increases from the ceramic substrate to the surface layer, and the ceramic member contains at least aluminum.

5. An anit-corrosion ceramic member as claimed in claim 1, wherein the surface layer is formed of aluminum fluoride 6. An anti-corrosion ceramic member as claimed in claim 1, wherein the concentration of the fluoride in the intermediate layer increases from the ceramic substrate to the surface layer and the surface layer is formed of aluminum fluoride.

7. An anti-corrosion ceramic member as claimed in claim 2, wherein the ceramic contains at least aluminum and the surface layer is formed of aluminum fluoride.

8. An anti-corrosion ceramic member as claimed in claim 1, wherein the concentration of the fluoride in the intermediate layer increases from the ceramic substrate to the surface layer and the ceramic member contains at least aluminum, and the surface layer is formed of aluminum fluoride.

9. An anti-corrosion ceramic member as claimed in claim 1, wherein the fluoride is present in the intermediate layer in an overall amount of from 20 vol % to 80 vol %.

10. An anti-corrosion ceramic member as claimed in claim 1, wherein the concentration of the fluoride in the intermediate layer increases from the ceramic substrate to the surface layer and the fluoride is present in the intermediate layer in an overall amount of from 20 vol % to 80 vol %.

11. An anti-corrosion ceramic member as claimed in claim 1, wherein the ceramic member contains at least aluminum and the surface layer is formed of aluminum fluoride, and fluoride is present in the intermediate layer in an overall amount of from 20 vol % to 80 vol %.

12. An anti-corrosion ceramic member as claimed in claim 1, wherein the thickness of the intermediate layer is 10 µm to 500 µm.

13. An anti-corrosion ceramic member as claimed in claim 1, wherein the concentration of the fluoride in the intermediate layer increases from the ceramic substrate to the surface layer and the thickness of the intermediate layer is 10 µm to 500 µm.

14. An anti-corrosion ceramic member as claimed in claim 1, wherein the ceramic member contains at least aluminum and the surface layer is formed of aluminum fluoride, and the thickness of the intermediate layer is 10 µm to 500 µm.

15. An anti-corrosion ceramic member as claimed to claim 1, wherein the ceramic member contains at least aluminum and the surface layer is formed of aluminum fluoride and the fluoride is present in the intermediate layer in an overall amount of from 20 vol % to 80 vol %, and the thickness of the intermediate layer is 10 µm to 500 µm.

16. A semiconductor-manufacturing device which is formed of an anti-corrosion ceramic member, said ceramic member comprising a substrate made of a ceramic material, a surface layer made of a fluoride and formed on the substrate, and an intermediate layer formed of the ceramic material and the fluoride between the substrate and the surface layer by immersing the ceramic substrate into hydrofluoric acid so that the fluoride in the intermediate layer fill in among grain boundaries thereof.

17. A semiconductor-manufacturing device as claimed in claim 16, wherein the concentration of the fluoride in the intermediate layer increases from the ceramic substrate to the surface layer.

18. A semiconductor-manufacturing device as claimed in claim 16, wherein the ceramic member contains at least aluminum and the surface layer is formed of aluminum fluoride.

19. A semiconductor-manufacturing device as claimed in claim 16, wherein a mixed rate of the fluoride in the intermediate layer is 20 vol % to 80 vol % and the thickness of the intermediate layer is 10 µm to 500 µm.

20. A semiconductor-manufacturing device as claimed in claim 16, wherein the ceramic member contains at least aluminum and the surface layer is formed of aluminum fluoride and the fluoride is present in the intermediate layer in an overall amount of from 20 vol % to 80 vol %, and the thickness of the intermediate layer is 10 µm to 500 µm.

21. An anti-corrosion ceramic member made by a process comprising:

positioning a substrate made of a ceramic material into a sealed container;

immersing said substrate in hydrogen fluoride and placing said container in an environment at a temperature of from about 100° to about 250° to produce a surface layer comprising fluoride and an intermediate layer formed of ceramic material and fluoride filled in among grain boundaries of said intermediate layer ceramic material, said intermediate layer being between said substrate and said surface layer.

22. An anti-corrosion ceramic member as claimed in claim 21, wherein the concentration of the fluoride in the intermediate layer increases from the ceramic substrate to the surface layer.

23. Anti-corrosion ceramic member as claimed in claim 21, wherein the ceramic member contains at least aluminum.

24. Anti-corrosion ceramic member as claimed in claim 21, wherein the surface layer is formed of aluminum fluoride.

25. Anti-corrosion ceramic member as claimed in claim 21, wherein the fluoride is present in the intermediate layer in an overall amount of from 20 vol % to 80 vol %.

26. Anti-corrosion ceramic member as claimed in claim 21, wherein the thickness of the intermediate layer is 10 µm to 500 µm.

\* \* \* \* \*